(12) United States Patent
Lai et al.

(10) Patent No.: US 9,941,011 B2
(45) Date of Patent: Apr. 10, 2018

(54) MEMORY ARRAY WITH ONE SHARED DEEP DOPED REGION

(71) Applicant: eMemory Technology Inc., Hsin-Chu (TW)

(72) Inventors: Tsung-Mu Lai, Hsinchu County (TW); Wen-Hao Ching, Hsinchu County (TW); Chen-Hao Po, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/352,609

(22) Filed: Nov. 16, 2016

(65) Prior Publication Data

US 2017/0206968 A1    Jul. 20, 2017

Related U.S. Application Data

(60) Provisional application No. 62/280,683, filed on Jan. 19, 2016.

(51) Int. Cl.
| | |
|---|---|
| *G11C 11/34* | (2006.01) |
| *G11C 16/12* | (2006.01) |
| *G11C 16/08* | (2006.01) |
| *G11C 16/24* | (2006.01) |
| *G11C 16/14* | (2006.01) |
| *H01L 27/11521* | (2017.01) |

(52) U.S. Cl.
CPC .............. *G11C 16/12* (2013.01); *G11C 16/08* (2013.01); *G11C 16/14* (2013.01); *G11C 16/24* (2013.01); *H01L 27/11521* (2013.01)

(58) Field of Classification Search
CPC ......... G11C 16/12; G11C 16/08; G11C 16/14; G11C 16/24; H01L 27/11521
USPC .................................................... 365/185.26
See application file for complete search history.

(56) References Cited

U.S. PATENT DOCUMENTS

| | | | |
|---|---|---|---|
| 4,617,652 | A | 10/1986 | Simko |
| 7,263,001 | B2 | 8/2007 | Wang |
| 7,663,916 | B2 | 2/2010 | Chih |
| 7,791,955 | B2 | 9/2010 | Ratnakumar |
| 7,983,081 | B2 | 7/2011 | Fang |
| 8,279,681 | B2 | 10/2012 | Yao |

(Continued)

FOREIGN PATENT DOCUMENTS

| | | |
|---|---|---|
| JP | 2013102119 A | 5/2013 |
| JP | 2013519182 A | 5/2013 |

(Continued)

*Primary Examiner* — Richard Elms
*Assistant Examiner* — Xiaochun L Chen
(74) *Attorney, Agent, or Firm* — Winston Hsu

(57) ABSTRACT

A memory array includes a plurality of memory pages, each memory page includes a plurality of memory cells, and each memory cell includes a floating gate module, a control element, and an erase element. The floating gate module is disposed in a first well, the erase element is disposed in a second well, and the control element is disposed in a third well. The first well, the second well and the third well are disposed in a deep doped region, and memory cells of the plurality of memory pages are all disposed in the deep doped region. Therefore, the spacing rule between deep doped regions is no longer be used to limit the circuit area of the memory array and the circuit area of the memory array can be reduced.

4 Claims, 12 Drawing Sheets

(56) References Cited

U.S. PATENT DOCUMENTS

| | | | |
|---|---|---|---|
| 8,284,600 B1* | 10/2012 | Poplevine | G11C 16/0441 |
| | | | 365/104 |
| 8,958,245 B2 | 2/2015 | Hsu | |
| 9,042,174 B2 | 5/2015 | Ching | |
| 2002/0085442 A1* | 7/2002 | Okuda | G11C 5/025 |
| | | | 365/223 |
| 2003/0063519 A1* | 4/2003 | Okuda | G11C 5/025 |
| | | | 365/233.1 |
| 2007/0296020 A1 | 12/2007 | Shiba | |
| 2013/0234227 A1 | 9/2013 | Chen | |
| 2014/0177338 A1 | 6/2014 | Ching | |

FOREIGN PATENT DOCUMENTS

| | | |
|---|---|---|
| JP | 201570264 A | 4/2015 |
| WO | 2011096978 A2 | 8/2011 |

\* cited by examiner

MEMORY ARRAY WITH ONE SHARED DEEP DOPED REGION

CROSS REFERENCE TO RELATED APPLICATIONS

This non-provisional application claims priority of U.S. provisional application No. 62/280,683, filed on Jan. 19, 2016, included herein by reference in its entirety.

BACKGROUND OF THE INVENTION

1. Field of the Invention

This invention relates to a memory array, and more particularly, a memory array with memory cells sharing one deep doped region.

2. Description of the Prior Art

An electrically rewritable nonvolatile memory is a type of memory that retains information it stores even when no power is supplied to memory blocks and allows on-board rewriting of a program. Due to the wide range of applications for various uses, there is a growing need for a nonvolatile memory to be embedded in the same chip with the main circuit, especially for personal electronic devices having strict requirements for circuit area.

A nonvolatile memory cell of prior art comprises one floating gate transistor for retaining data, and one or two select transistors for enabling the floating gate transistor to perform corresponding operations. The floating gate may be controlled by coupling elements for program operations and erase operations. Since memory cells in different memory pages should be controlled independently, memory cells in different memory pages are usually disposed in isolated regions. However, due to the spacing rule of the manufacture, the spare area between different isolated regions can significantly increase the circuit area. Furthermore, since no elements are allowed to be disposed on the spare area, the increased circuit area is simply wasted. Therefore, how to reduce the circuit area and use the circuit area more efficiently has become an issue to be solved.

SUMMARY OF THE INVENTION

One embodiment of the present invention discloses a memory array. The memory array includes a plurality of memory pages, each memory page includes a plurality of memory cells, and each memory cell includes a floating gate module, a control element, and an erase element.

The floating gate module includes a floating gate transistor. The floating gate module can control the floating gate transistor according to a source line, a bit line and a word line. The floating gate transistor has a first terminal, a second terminal and a floating gate. The control element has a body terminal coupled to a control line, a first terminal coupled to the body terminal, a second terminal coupled to the body terminal, and a control terminal coupled to the floating gate. The erase element has a body terminal for receiving a first voltage during a program operation and a program inhibit of the memory cell and receiving a second voltage during an erase operation of the memory cell, a first terminal coupled to an erase line, a second terminal coupled to the first terminal of the erase element or being floating, and a control terminal coupled to the floating gate.

The floating gate module is disposed in a first well, the erase element is disposed in a second well, and the control element is disposed in a third well. The first well, the second well and the third well are disposed in a deep doped region. Memory cells of the plurality of memory pages are all disposed in the deep doped region. The control line is at the first voltage during the program operation, and the erase line is at the second voltage during the erase operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
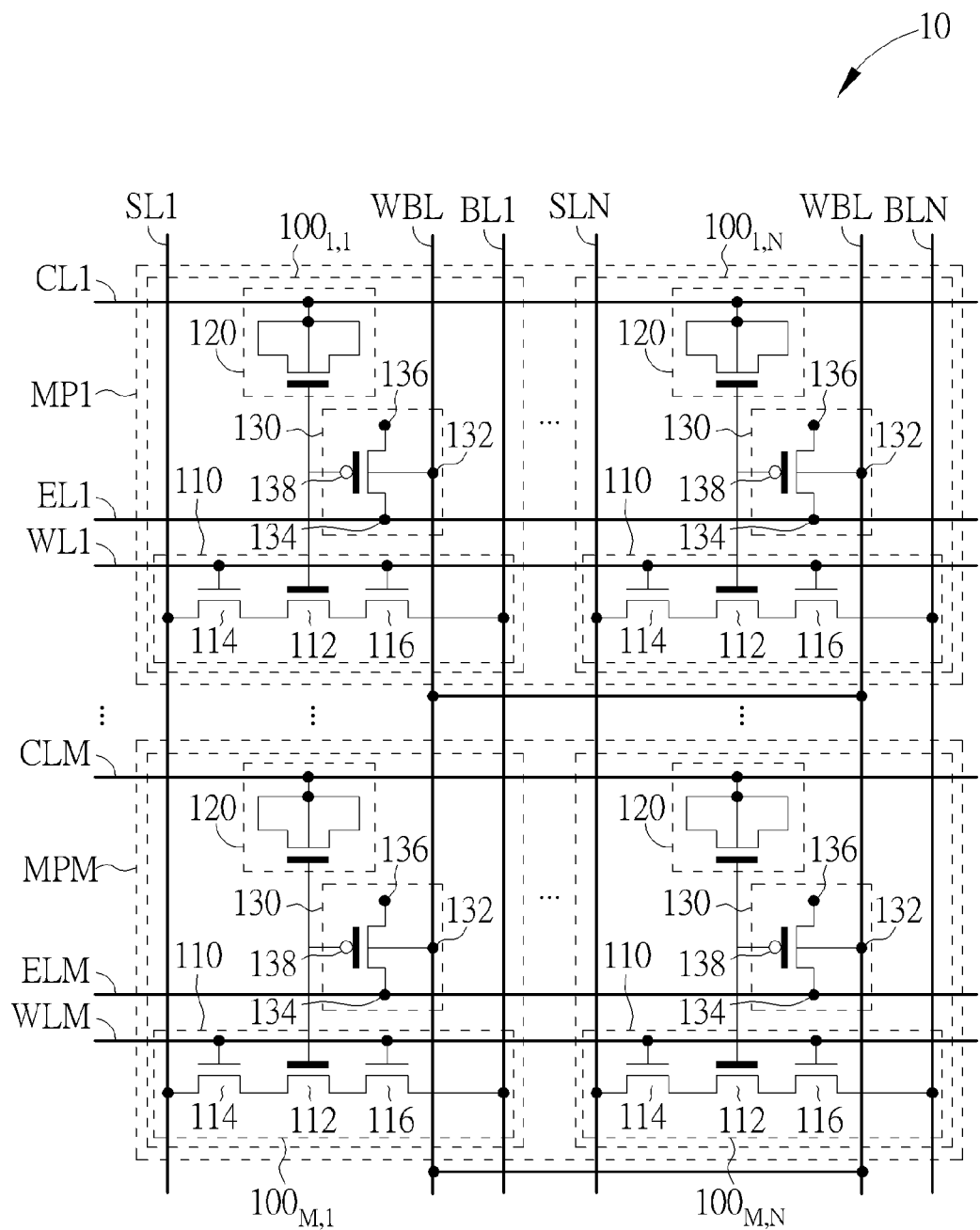
FIG. 1 shows a memory array according to one embodiment of the present invention.

FIG. 1 shows a memory array 10 according to one embodiment of the present invention. The memory array 10 includes M memory pages MP1 to MPM. Each memory page MP1 to MPM includes N memory cells. For example, the memory page MP1 includes memory cells $100_{1,1}$ to $100_{1,N}$, and the memory page MPM includes memory cells $100_{M,1}$ to $100_{M,N}$. M and N are positive integers.

In some embodiments of the present invention, memory cells in the same memory page may be coupled to a same control line, a same erase line, and a same word line, but may be coupled to different source lines and different bit lines. For example, the memory cells $100_{1,1}$ to $100_{1,N}$ in the same memory page MP1 are coupled to the same control line CL1, the same erase line EL1, and the same word line WL1. However, the memory cell $100_{1,1}$ is coupled to a source line SL1 and a bit line BL1 while the memory cell $100_{1,N}$ is coupled to a source line SLN and a bit line BLN.

In addition, memory cells in different memory pages but in the same column may be coupled to different control lines, different erase lines, and different word lines, but may be coupled to a same source line and a same bit line. For example, the memory cells $100_{1,1}$ and $100_{M,1}$ are disposed in the same column but in different memory pages MP1 and MPM. The memory cells $100_{1,1}$ and $100_{M,1}$ are coupled to the same source line SL1 and the same bit line BL1. However, the memory cell $100_{1,1}$ is coupled to the control line CL1, the erase line EL1, and the word line WL1 while the memory cell $100_{M,1}$ is coupled to the control line CLM, the erase line ELM, and the word line WLM.

In FIG. 1, the memory cells $100_{1,1}$ to $100_{1,N}$, . . . , and $100_{M,1}$ to $100_{M,N}$ have same structures. Each memory cell includes a floating gate module 110, a control element 120, and an erase element 130. The floating gate module 110 includes a floating gate 112, a source transistor 114, and a bit transistor 116. The floating gate module 110 can control the floating gate transistor 112 according to a source line, a bit line and a word line.

The floating gate transistor 112 has a first terminal, a second terminal and a floating gate. The source transistor 114 has a first terminal, a second terminal, and a control terminal. The first terminal of the source transistor 114 is coupled to a corresponding source line. For example, the first terminal of the source transistor 114 of the memory cell $100_{1,1}$ may be coupled to the source line SL1, and the first terminal of the source transistor 114 of the memory cell $100_{1,N}$ may be coupled to the source line SLN. The second terminal of the source transistor 114 is coupled to the first terminal of the floating gate transistor 112, and the control terminal of the source transistor 114 is coupled to a corresponding word line WL1. For example, the control terminal of the source transistor 114 of the memory cell $100_{1,1}$ may be coupled to the word line WL1, and the control terminal of the source transistor 114 of the memory cell $100_{M,1}$ may be coupled to the word line WLM.

The bit transistor 116 has a first terminal, a second terminal, and a control terminal. The first terminal of the bit transistor 116 is coupled to the second terminal of the floating gate transistor 112, the second terminal of the bit transistor 116 is coupled to a corresponding bit line, and the control terminal of the bit transistor 116 is coupled to a corresponding word line. For example, the second terminal of the bit transistor 116 of the memory cell $100_{1,1}$ may be coupled to the bit line BL1, and the second terminal of the bit transistor 116 of the memory cell $100_{1,N}$ may be coupled to the bit line BLN. Also, the control terminal of the bit transistor 116 of the memory cell $100_{1,1}$ may be coupled to the word line WL1, and the control terminal of the bit transistor 116 of the memory cell $100_{M,1}$ may be coupled to the word line WLM.

The control element 120 has a first terminal coupled to the body terminal, a second terminal coupled to the body terminal, a control terminal coupled to the floating gate of the floating gate transistor 112, and a body terminal coupled to a corresponding control line. For example, the body terminal of the control element 120 of the memory cell $100_{1,1}$ may be coupled to the control line CL1, and the body terminal of the control element 120 of the memory cell $100_{M,1}$ may be coupled to the control line CLM.

The erase element 130 has a first terminal, a second terminal, a control terminal, and a body terminal. The first terminal 134 of the erase element 130 is coupled to a corresponding erase line. For example, the first terminal of the erase element 130 of the memory cell $100_{1,1}$ is coupled to the erase line EL1, and the first terminal of the erase element 130 of the memory cell $100_{M,1}$ is coupled to the erase line ELM. The second terminal 136 of the erase element 130 is coupled to the first terminal of the erase element 130 or floating, the control terminal 138 of the erase element 130 is coupled to the floating gate of the floating gate transistor 112, and the body terminal 132 of the erase element 130 is coupled to a well bias line WBL.

Figure 2:
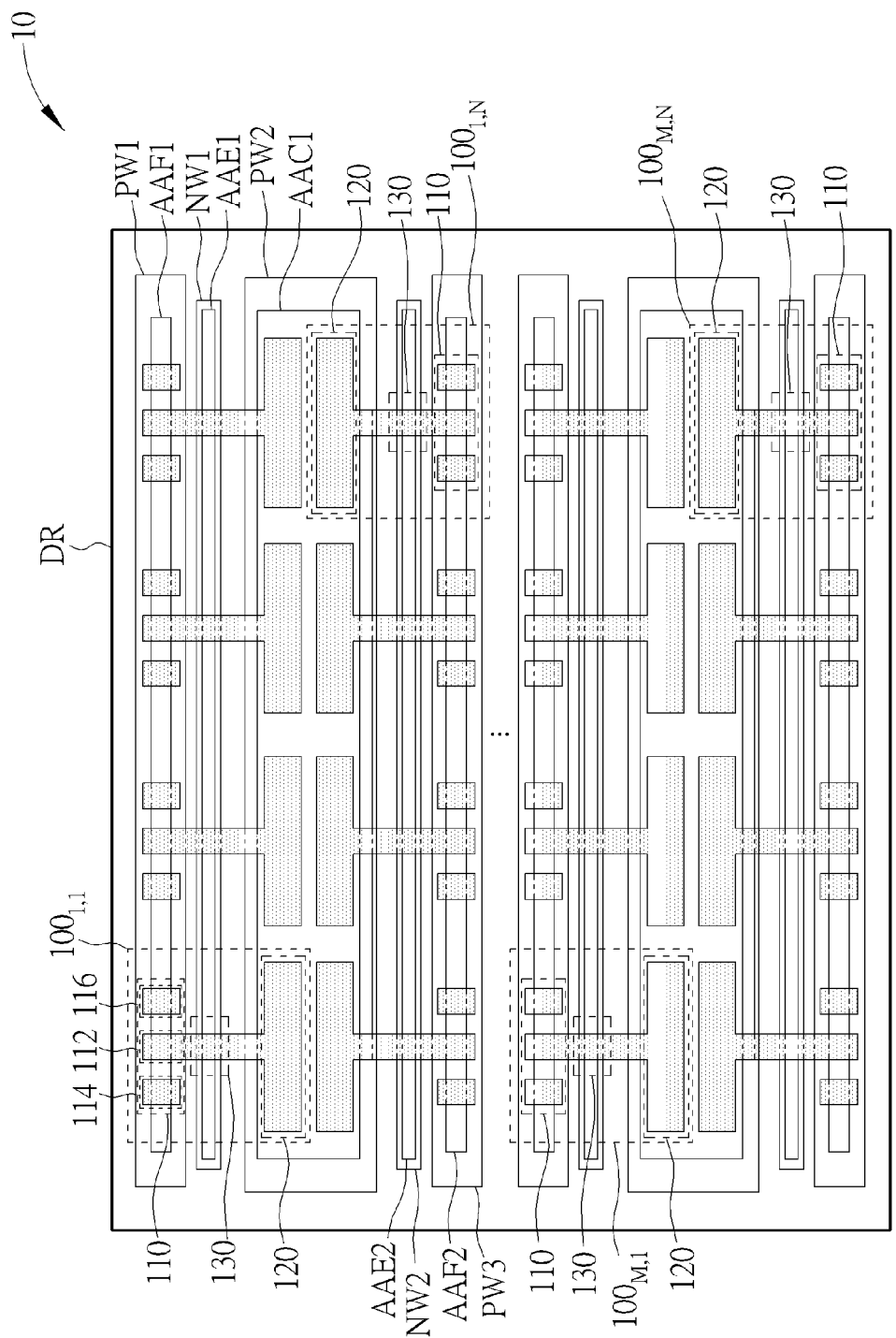
FIG. 2 shows a layout of the memory array in FIG. 1 according to one embodiment of the present invention.

FIG. 2 shows a layout of the memory array 10 according to one embodiment of the present invention. The floating gate module 110 of the memory cell $110_{1,1}$ can be disposed in an active region AAF1 of a first P-well PW1, the erase element 130 of the memory cell $110_{1,1}$ can be disposed in an active region AAE1 of a first N-well NW1, and the control element 120 of the memory cell $110_{1,1}$ can be disposed in an active region AAC1 of a second P-well PW2. The first P-well PW1, the first N-well NW1 and the second P-well PW2 are disposed in the same deep doped region DR. In some embodiments, the deep doped region DR can be a deep N-well or an N-type buried layer.

Figure 3:
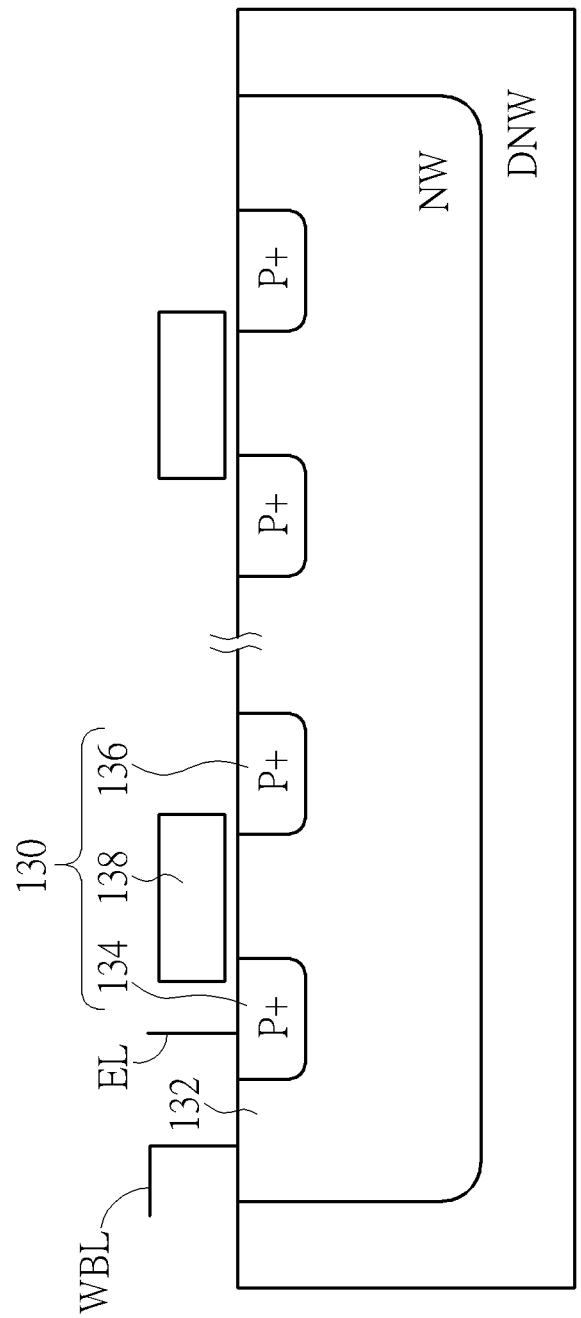
FIG. 3 shows a section view of the erase elements according to the layout in FIG. 2.

FIG. 3 shows a section view of the erase elements 130 according to the layout in FIG. 2. In FIG. 3, the erase element 130 has a structure similar to a P-type metal-oxide-semiconductor transistor. That is, the body terminal 132 of the erase element 130 is at the N-well NW, and the first terminal 134 and the second terminal 136 are two P-type doped regions P+ disposed in the N-well NW. In FIG. 3, the well bias line WBL is coupled to the body terminal 132 directly. However, in some embodiments, the well bias line WBL may also be coupled to the N-well NW through a contact or an N-type doped region in the N-well NW. The floating gate of the floating gate transistor 112 is coupled to the control terminal 138 of the erase element 130 forming a gate structure. Since the erase line EL is coupled to the first terminal 134 of the erase element 130, the memory cells $110_{1,1}$ to $110_{1,N}$, . . . , and $110_{M,1}$ to $110_{M,N}$ can function correctly even with the their body terminals 132 of the erase elements 130 coupled to the same well bias line WBL. That is, the memory cells $110_{1,1}$ to $110_{1,N}$, . . . , and $110_{M,1}$ to $110_{M,N}$ can be disposed in the same deep doped region DR, which is coupled to the same well bias line WBL.

For example, in FIG. 2, the floating gate module 110 of the memory cell $110_{1,N}$ can be disposed in an active region AAF2 of a third P-well PW3, the erase element 130 of the memory cell $110_{1,N}$ can be disposed in an active region AAE2 of a second N-well NW2, and the control element 120 of the memory cell $110_{1,N}$ can be disposed in the active region AAC1 of the second P-well PW2; however, the third P-well PW3 and the second N-well NW2 are still disposed in the same deep doped region DR.

Also, although the floating gate modules, the control elements, and the erase elements of the memory cells $110_{M,1}$ to $110_{M,N}$ may be disposed in different wells as shown in FIG. 2, the different wells of the memory cells $110_{M,1}$ to $110_{M,N}$ can still be disposed in the same deep doped region DR. Namely, memory cells $110_{1,1}$ to $110_{1,N}$, . . . , and $110_{M,1}$ to $110_{M,N}$ of the M memory pages MP1 to MPM can all be disposed in the same deep doped region DR. Since different memory pages MP1 to MPM in the memory array 10 are disposed in one deep doped region DR, the spacing rules between deep doped regions will no longer be used to limit the circuit area of the memory array 10, and the circuit area of the memory array 10 can be reduced significantly.

In FIG. 2, the control elements 120 of the memory cells in the same memory page, such as the memory cells $110_{1,1}$ to $110_{1,N}$ in the memory page MP1, can be disposed in the same second P-well PW2. The floating gate modules 110 of the memory cells $110_{1,1}$ to $110_{1,N}$ can be disposed in two different P-wells PW1 and PW3, which are disposed in opposite sides of the second P-well PW2. The erase elements 130 of the memory cells $110_{1,1}$ to $110_{1,N}$ can be disposed in two different N-wells NW1 and NW2, which are disposed in opposite sides of the second P-well PW2. Therefore, the layout of the memory array 10 will not extend to one single direction, and the layout of the memory array 10 can be more flexible. However, in some embodiments, the floating gate modules 110 of the memory cells in the same memory page can also be disposed in one P-well and the erase elements 130 of the memory cells in the same memory page can be disposed in one N-well according to the system requirements.

Figure 4:
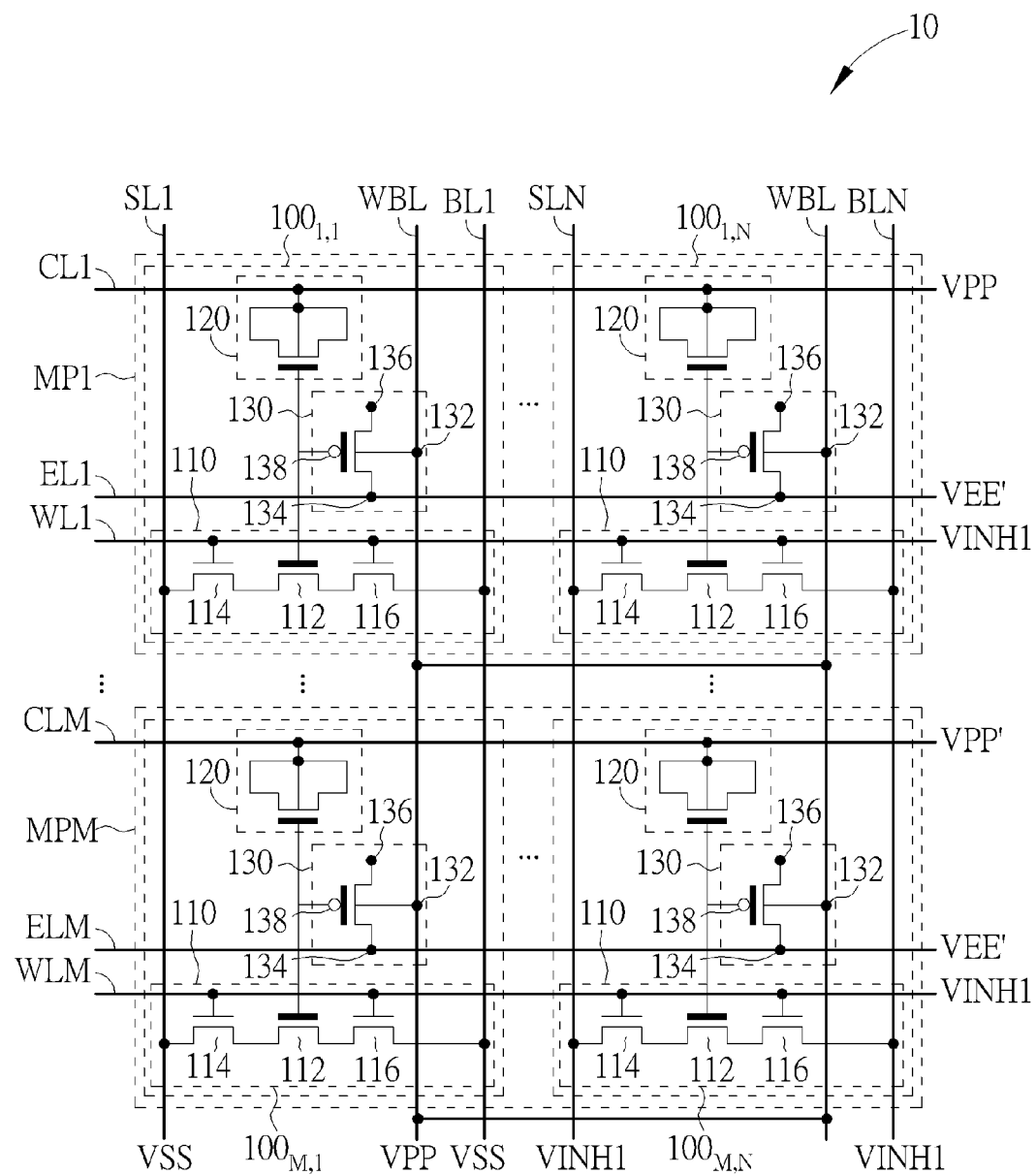
FIG. 4 shows voltages of the signals during a program operation of a memory cell in the memory array of FIG. 1.

FIG. 4 shows voltages of the signals during a program operation of the memory cell $100_{1,1}$ in the memory array 10. In FIG. 4, the first voltage VPP is substantially equal to the second voltage VEE. The first voltage VPP is greater than the third voltage VEE', the third voltage VEE' is greater than the fourth voltage VINH1, and the fourth voltage VINH1 is greater than the fifth voltage VSS. Also, the first voltage VPP is greater than the sixth voltage VPP', and the sixth voltage VPP' is greater than the fifth voltage VSS.

In some embodiments, the difference between the third voltage VEE' and the fifth voltage VSS is greater than half of the difference between the first voltage VPP and the fifth voltage VSS. The difference between the fourth voltage VINH1 and the fifth voltage VSS is smaller than half of the difference between the first voltage VPP and the fifth voltage VSS, and the difference between the sixth voltage VPP' and the fifth voltage VSS is smaller than half of the difference between the first voltage VPP and the fifth voltage VSS. For example, if the first voltage VPP is 18V, the second voltage VEE is in a range between 17V and 18V, and the fifth voltage VSS is 0V, then the third voltage VEE' may be 13V, the fourth voltage VINH1 may be 6V, and the sixth voltage VPP' may also be 6V.

According to FIG. 4, during the program operation of the memory cell $100_{1,1}$, the control line CL1 is at the first voltage VPP, the erase line EL1 is at the third voltage VEE', the word line WL1 is at the fourth voltage VINH1, the source line SL is at the fifth voltage VSS, and the bit line BL is at the fifth voltage VSS.

In this case, the control element 120 of the memory cell $100_{1,1}$ is coupled to a high voltage by the control line CL1. The source transistor 114 and the bit transistor 116 are turned on so the first terminal and the second terminal of the floating gate transistor 112 of the memory cell $100_{1,1}$ are pulled down to a low voltage. Therefore, the high voltage difference applied to the floating gate transistor 112 will induce FN (Fowler Nordheim) electron tunneling injection to the floating gate, and the memory cell $100_{1,1}$ can be programmed. Also, to prevent leakage currents generated between the P-wells and the N-wells in the memory array 10, the voltage of the well bias line WBL should not be smaller than the greatest voltage of all the signals. In this case, the well bias line WBL would be at the first voltage VPP.

Also, to prevent the memory cell $100_{1,N}$ in the same memory page MP1 as the memory cell $100_{1,1}$ from being programmed during the program operation of the memory cell $100_{1,1}$, the memory cell $100_{1,N}$ may perform a program inhibit operation during the program operation of the memory cell $100_{1,1}$. During the program inhibit operation of the memory cell $100_{1,N}$, the control line CL1 is at the first voltage VPP, the erase line EL1 is at the third voltage VEE', the word line WL1 is at the fourth voltage VINH1, the source line SLN is at a fourth voltage VINH1, and the bit line BLN is at the fourth voltage VINH1.

In this case, although the memory cell $100_{1,N}$ is coupled to the same control line CL1, the erase line EL1, and the word line WL1 as the memory cell $100_{1,1}$, the memory cell $100_{1,N}$ will not be programmed due to the effect of channel boost caused by the source transistor 114 and the bit transistor 116 of the memory cell $100_{1,N}$. That is, the voltages of the first terminal and the second terminal of the floating gate transistor 112 are boosted to a voltage level higher than the fourth voltage VINH1, so the floating gate of the memory cell $100_{1,N}$ is not able to capture enough electrons and the memory cell $100_{1,N}$ will not be programmed. Also, since the control line CL1 is at the first voltage VPP, the well bias line WBL is still at the first voltage VPP during the program inhibit operation of the memory cell $100_{1,N}$.

Furthermore, during the program operation of the memory cell $100_{1,1}$, memory cells in unselected memory pages, such as the memory page MPM, should not be programmed. Therefore, in FIG. 4, a control line CLM coupled to an unselected memory cell $100_{M,1}$ in an unselected memory page MPM is at the sixth voltage VPP', an erase line ELM coupled to the unselected memory cell $100_{M,1}$ is at the third voltage VEE', and a word line WLM coupled to the unselected memory cell $100_{M,1}$ is at the fourth voltage VINH1.

Since the body terminal of the erase element 130 of the memory cell $100_{M,1}$ is coupled to the well bias line WBL, which is at the first voltage VPP, the voltage of the erase line ELM cannot be too low; otherwise, the erase element 130 may breakdown. Meanwhile, the voltage of the erase line ELM cannot be too high; otherwise, the floating gate of the memory cell $100_{M,1}$ may be programmed unexpectedly. Therefore, the erase line ELM can be at the third voltage VEE' during the program operation of the memory cell $100_{1,1}$, and the difference between the third voltage VEE' and the fifth voltage VSS can be slightly greater than half of the difference between the first voltage VPP and the fifth voltage VSS. In this case, the erase element 130 will not breakdown and the memory cell $100_{M,1}$ will not be programmed unexpectedly.

Also, the voltage of the control line CLM should not be too low; otherwise, the memory cell $100_{M,1}$ may be unstable. Therefore, the control line CLM is at the sixth voltage VPP' during the program operation of the memory cell $100_{1,1}$, and the difference between the sixth voltage VPP' and the fifth voltage VSS can be slightly smaller than half of the difference between the first voltage VPP and the fifth voltage VSS. In this case, the erase element 130 can remain stable.

In addition, since memory cells in the same column but different memory pages are coupled to the same source line and the same bit line, the word line may be at the fourth voltage VINH1 for reducing the gate-induced drain leakage (GIDL) current. For example, during the program operation of the memory cell $100_{1,1}$ and the program inhibit operation of the memory cell $100_{1,N}$, the source line SLN and the bit line BLN coupled to the memory cell $100_{M,N}$ are at the fourth voltage VINH1. If the word line WLM is at the fifth voltage VSS, the big voltage difference may cause GIDL currents at the source transistor 114 and the bit transistor 116 of the memory cell $100_{M,N}$. However, the word line WLM at the fourth voltage VINH1 can avoid the GIDL currents efficiently while not affecting the operations of other memory cells.

Figure 5:
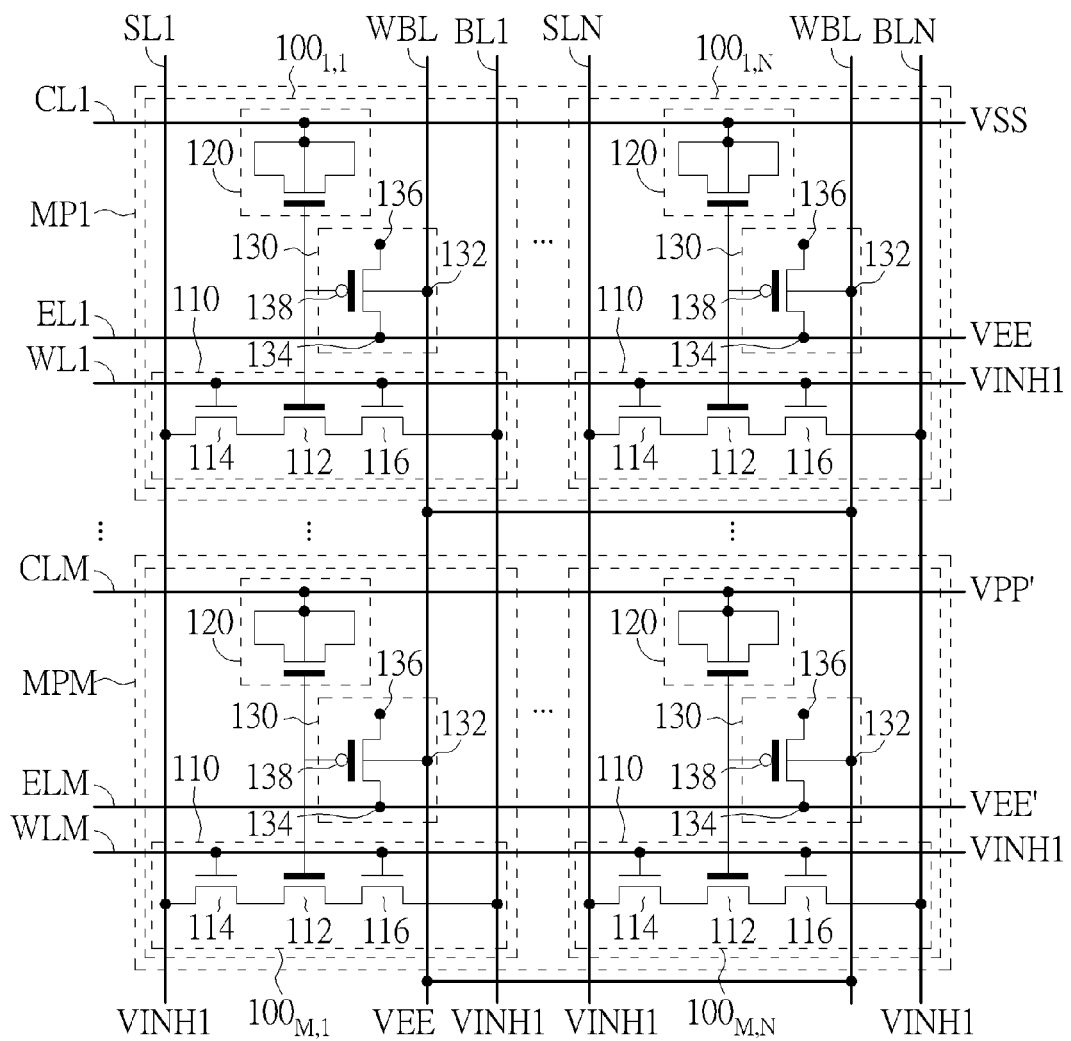
FIG. 5 shows voltages of the signals during an erase operation of a memory cell in the memory array of FIG. 1.

FIG. 5 shows voltages of the signals during an erase operation of the memory cell $100_{1,1}$ in the memory array 10. During an erase operation of the memory cell $100_{1,1}$, the erase line EL1 is at the second voltage VEE, the word line WL1 is at the fourth voltage VINH1 or the fifth voltage VSS, the source line SL1 is at the fourth voltage VINH1, the bit line BL1 is at the fourth voltage VINH1, and the control line CL1 is at the fifth voltage VSS.

In this case, the high voltage of the erase line EL1 can cause FN electron tunneling ejection so the memory cell $100_{1,1}$ can be erased. In addition, since the erase line EL1 has the greatest voltage, that is, the second voltage VEE, among all the signals during the erase operation of the memory cell $100_{1,1}$, the well bias line WBL would be at the second voltage VEE.

In some embodiments of the present invention, the memory array 10 can be erased by page. That is, memory cells at the same memory page, such as the memory cells $100_{1,1}$ to $100_{1,N}$ in the memory page MP1, will be erased at the same time. In this case, the source lines SL1 to SLN and the bit lines BL1 to BLN coupled to the memory cells $100_{1,1}$ to $100_{1,N}$ may all be at a same rather low voltage. For example, the source lines SL1 to SLN and the bit lines BL1 to BLN may all be at the fourth voltage VINH1 or at the fifth voltage VSS. In this case, the difference between the fourth voltage VINH1 and the fifth voltage VSS can be smaller than half of the difference between the second voltage VEE and the fifth voltage VSS.

In addition, during the erase operation of the memory cell $100_{1,1}$, memory cells in unselected memory pages, such as the memory page to MPM, should not be erased. For example, to prevent the memory cell $100_{M,1}$ in the unselected memory page MPM from being erased, the voltage of the erase line ELM should not be too high. However, since the well bias line WBL is at the second voltage VEE, the voltage of the erase line ELM cannot be too low; otherwise, the erase element 130 of the memory cell memory cell $100_{1,1}$ may breakdown. Therefore, according to FIG. 5, the erase line ELM can be at the third voltage VEE'. The difference between the third voltage VEE' and the fifth voltage VSS can be slightly greater than half of the difference between the second voltage VEE and the fifth voltage VSS.

In this case, the voltage of the erase line ELM is not high enough to erase the memory cell $100_{M,1}$ and is not low enough to make the erase element 130 breakdown. The control line CLM is at the sixth voltage VPP' so that the memory cell $100_{M,1}$ will not be programmed or erased unexpectedly by the erase line ELM. In FIG. 5, the difference between the sixth voltage VPP' and the fifth voltage VSS is smaller than half of the difference between the second voltage VEE and the fifth voltage VSS. Similarly, the word line WLM, the source line SL1, and the bit line BL1 can be at approximate voltages so that the memory cell $100_{M,1}$ will not be programmed or erased unexpectedly by the erase line ELM while the GIDL current can be prevented. In some embodiments, the word line WLM, the source line SL1, and the bit line BL1 can be at the fourth voltage VINH1.

Figure 6:
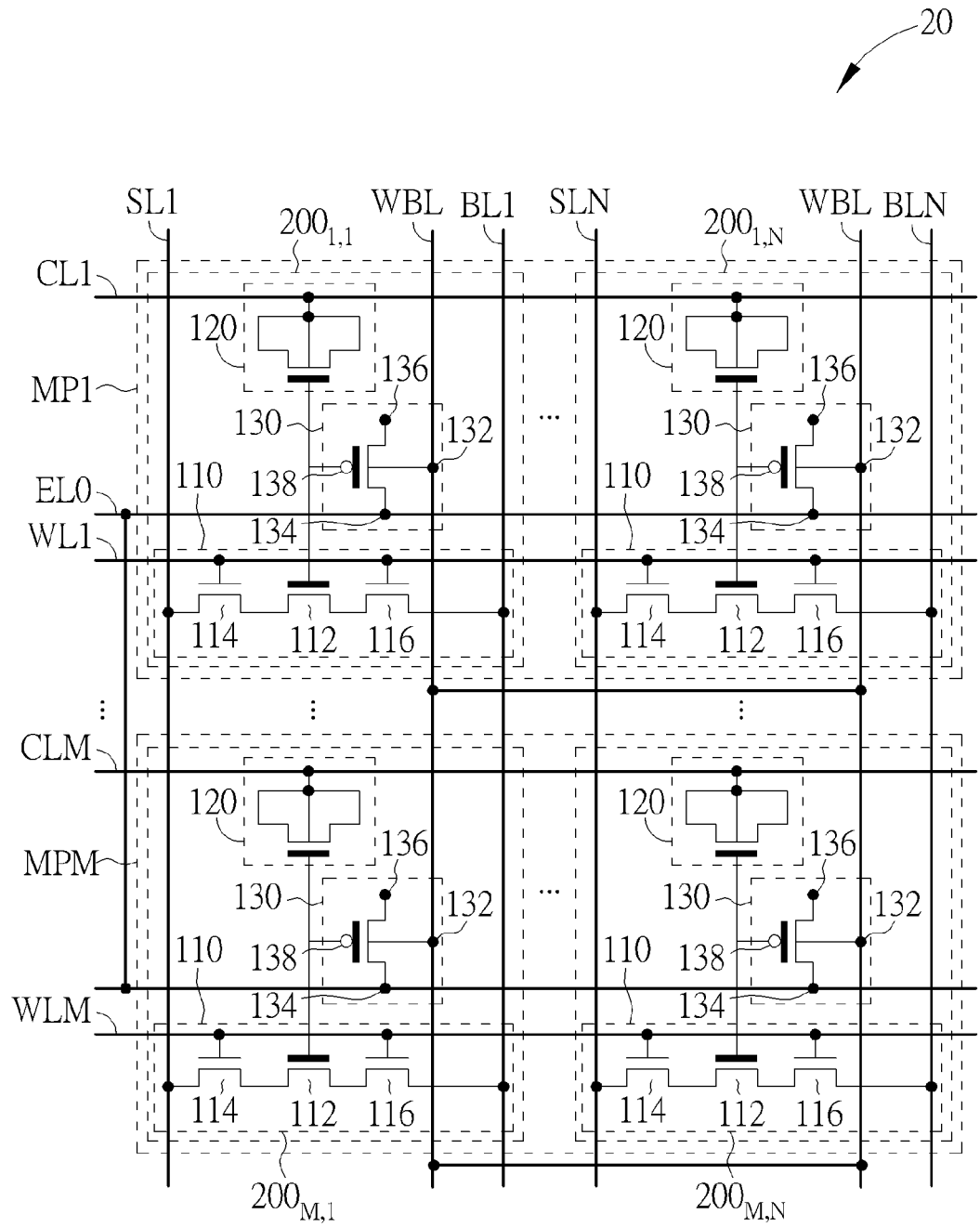
FIG. 6 shows a memory array according to another embodiment of the present invention.

In some embodiments of the present invention, the memory array can be erased by sector. That is, memory cells in the memory array can all be erased at the same time. FIG. 6 shows a memory array 20 according to one embodiment of the present invention. The memory arrays 10 and 20 have similar structures. The difference between these two is in that the memory cells $200_{1,1}$ to $200_{1,N}$, ..., and $200_{M,1}$ to $200_{M,N}$ are all coupled to the same erase line EL0, so the memory cells $200_{1,1}$ to $200_{1,N}$, ..., and $200_{M,1}$ to $200_{M,N}$ in the memory array 20 will all be erased at the same time.

Figure 7:
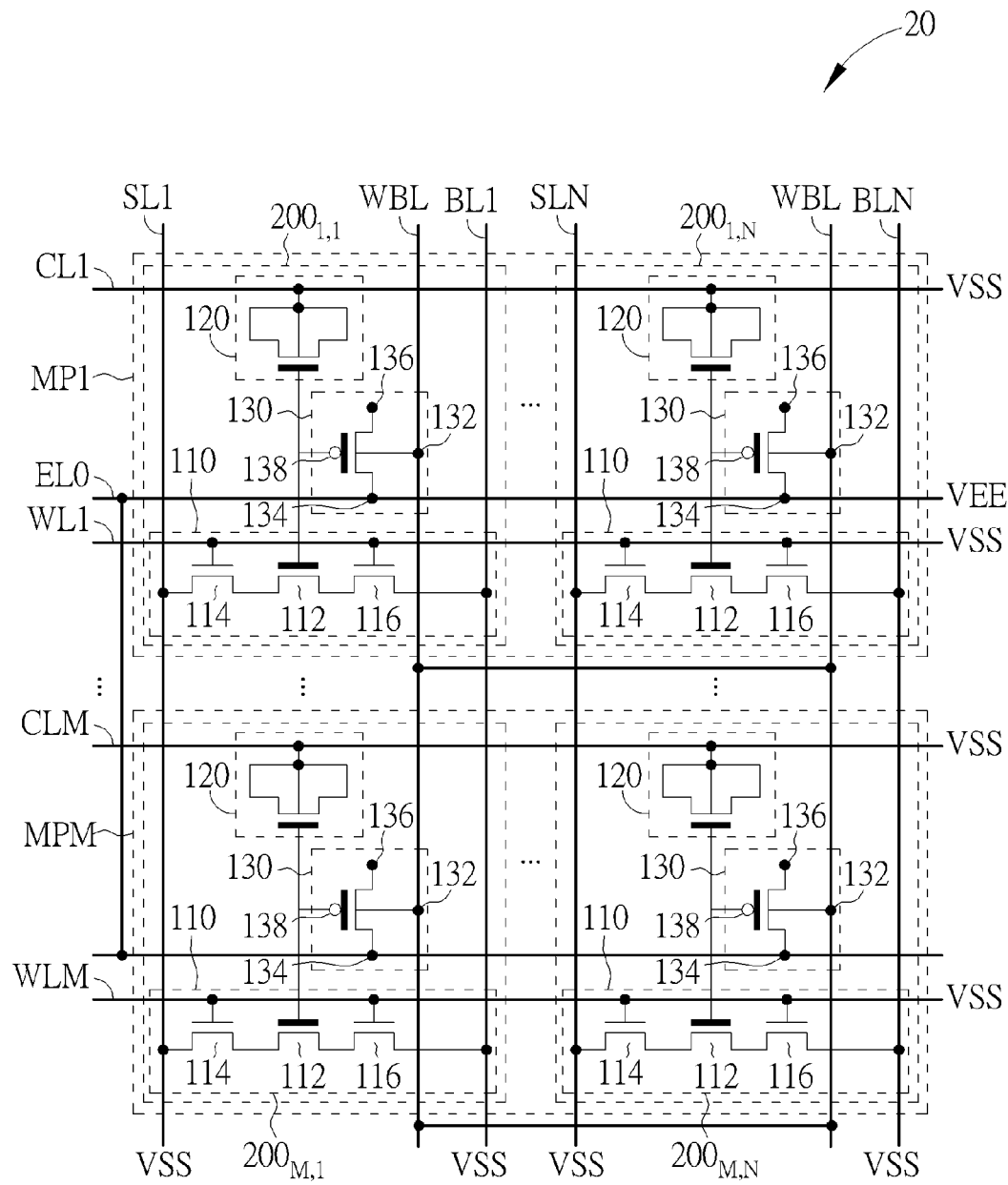
FIG. 7 shows voltages of the signals during an erase operation of a memory cell in the memory array of FIG. 6.

FIG. 7 shows voltages of the signals during an erase operation of the memory cell $200_{1,1}$ in the memory array 20.

During the erase operation of the memory cells $200_{1,1}$, the erase line EL0 is at the second voltage VEE, the control line CL1 is at the fifth voltage VSS, the source line SL1 and the bit line BL1 are both at the fourth voltage VINH1 or at the fifth voltage VSS, while the word line is at the fourth voltage VINH1 or at the fifth voltage VSS.

In this case, the high voltage of the erase line EL0 can cause FN electron tunneling ejection so the memory cell $200_{1,1}$ can be erased. Since the memory cells $200_{1,1}$ to $200_{1,N}$, ..., and $200_{M,1}$ to $200_{M,N}$ in the memory array 20 are erased at the same time, voltages of the signals received by all the memory cells $200_{1,1}$ to $200_{1,N}$, ..., and $200_{M,1}$ to $200_{M,N}$ can be the same.

In addition, since the erase line is at the third voltage VEE' during the program operation and the program inhibit operation, the memory array 20 can be operated with the same principle as the memory array 10 during the program operation and the program inhibit operation as shown in FIG. 4.

Consequently, the memory cells $200_{1,1}$ to $200_{1,N}$, ..., and $200_{M,1}$ to $200_{M,N}$ of the memory array 20 can all be disposed in the same deep doped region. Since different memory pages MP1 to MPM in the memory array 20 are disposed in one deep doped region, the spacing rules between deep doped regions will no longer be used to limit the circuit area of the memory array 20, and the circuit area of the memory array 20 can be reduced significantly. In addition, since all the memory cells $200_{1,1}$ to $200_{1,N}$, ..., and $200_{M,1}$ to $200_{1,4,N}$ of the memory array 20 are coupled to the same erase line, the driving circuit for providing the erase line can be simplified, which can further reduce the chip area required by the memory array 20.

Figure 8:
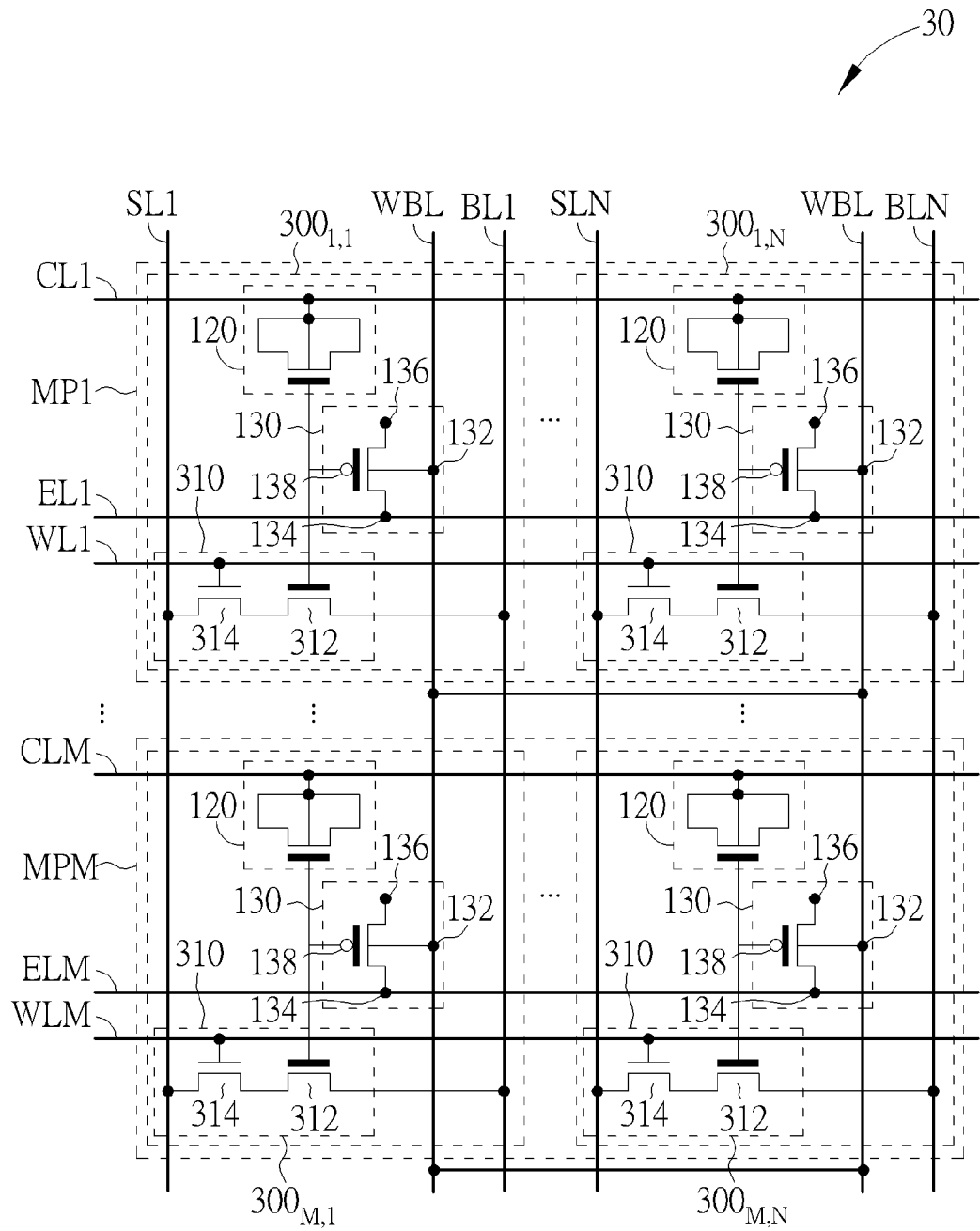
FIG. 8 shows a memory array according to another embodiment of the present invention.

FIG. 8 shows a memory array 30 according to one embodiment of the present invention. The memory array 30 has the similar structure as the memory array 10. The difference between these two is in that each of the memory cells $300_{1,1}$ to $300_{1,N}$, ..., and $300_{M,1}$ to $300_{1,4,N}$ has a floating gate module 310, a control element 120 and an erase element 130.

The floating gate module 310 includes a floating gate 312 and a source transistor 314. The floating gate transistor 312 has a first terminal, a second terminal, and a floating gate. The second terminal of the floating gate transistor 312 is coupled to a corresponding bit line. For example, the second terminal of the floating gate transistor 312 of the memory cell $300_{1,1}$ is coupled to the bit line BL1, and the second terminal of the floating gate transistor 312 of the memory cell $300_{1,N}$ is coupled to the bit line BLN. The floating gate of the floating gate transistor 312 is coupled to the control element 120 and the erase element 130.

The source transistor 314 has a first terminal, a second terminal, and a control terminal. The first terminal of the source transistor 314 is coupled to a corresponding source line. For example, the first terminal of the source transistor 314 of the memory cell $300_{1,1}$ can be coupled to the source line SL1, and the first terminal of the source transistor 314 of the memory cell $300_{1,N}$ can be coupled to the source line SLN. The second terminal of the source transistor 314 is coupled to the first terminal of the floating gate transistor 112, and the control terminal of the source transistor 314 is coupled to a corresponding word line. For example, the control terminal of the source transistor 314 of the memory cell $300_{1,1}$ can be coupled to the word line WL1, and the control terminal of the source transistor 314 of the memory cell $300_{M,1}$ can be coupled to the word line WLM.

Figure 9:
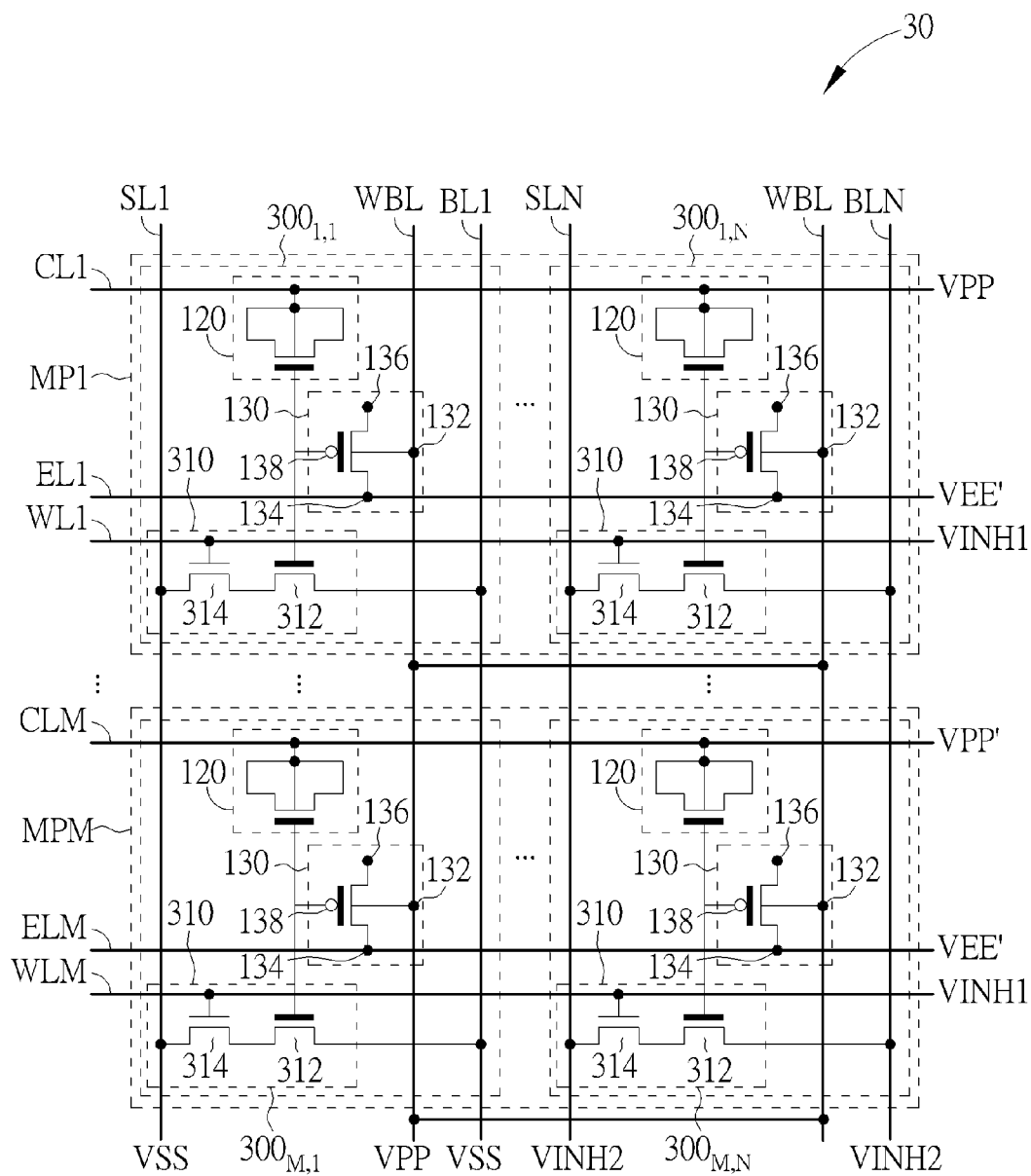
FIG. 9 shows voltages of the signals during a program operation of a memory cell in the memory array of FIG. 8.

FIG. 9 shows voltages of the signals during a program operation of the memory cell $300_{1,1}$ in the memory array 30.

In FIG. 9, during the program operation of the memory cell $300_{1,1}$, the control line CL1 is at the first voltage VPP, the erase line EL1 is at the third voltage VEE', the word line WL1 is at the fourth voltage VINH1, the source line SL1 is at the fifth voltage VSS, and the bit line BL1 is at the fifth voltage VSS.

In this case, the control element 120 of the memory cell $300_{1,1}$ is coupled to a high voltage by the control line CL1.

The source transistor 314 is turned on so the first terminal and the second terminal of the floating gate transistor 312 of the memory cell $300_{1,1}$ are pulled down to a low voltage. Therefore, the high voltage difference applied to the floating gate transistor 312 will induce FN (Fowler Nordheim) electron tunneling injection to the floating gate, and the memory cell $300_{1,1}$ can be programmed. Also, to prevent leakage currents generated between the P-wells and the N-wells in the memory array 30, the voltage of the well bias line WBL should not be smaller than the greatest voltage of all the signals. In this case, the well bias line WBL would be the first voltage VPP.

Also, in some embodiments, to prevent the memory cell $300_{1,N}$ in the same memory page MP1 as the memory cell $300_{1,1}$ from being programmed during the program operation of the memory cell $300_{1,1}$, the memory cell $300_{1,N}$ may perform a program inhibit operation during the program operation of the memory cell $300_{1,1}$. During the program inhibit operation of the memory cell $300_{1,N}$, the control line CL1 is at the first voltage VPP, the erase line EL1 is at the third voltage VEE', the word line WL1 is at the fourth voltage VINH1, the source line SLN is at a seventh voltage VINH2, and the bit line BLN is at the seventh voltage VINH2.

Since the second terminal of the floating gate transistor 312 is coupled to the corresponding bit line, the bit line BLN may have to be at a rather high voltage to prevent the memory cell $300_{1,N}$ from being programmed. In this case, the bit line BLN can be at the seventh voltage VINH2. The difference between the seventh voltage VINH2 and the fifth voltage VSS must be smaller than the source/drain junction breakdown voltage of the floating gate transistor 312. For example, if the source/drain junction breakdown voltage of the floating gate transistor 312 is 9V, the seventh voltage VINH2 may be 8V.

In this case, although the memory cell $300_{1,N}$ is coupled to the same control line CL1, the erase line EL1, and the word line WL1 as the memory cell $300_{1,1}$, the memory cell $300_{1,N}$ will not be programmed due to the rather high voltages at the first terminal and the second terminal of the floating gate transistor 312 of the memory cell $300_{1,N}$. Also, since the control line CL1 is at the first voltage VPP, the well bias line WBL is still at the first voltage VPP during the program inhibit operation of the memory cell $300_{1,N}$.

Furthermore, during the program operation of the memory cell $300_{1,1}$, memory cells in unselected memory pages, such as the memory page to MPM, should not be programmed. Therefore, in FIG. 9, a control line CLM coupled to an unselected memory cell $300_{M,1}$ in an unselected memory page MPM is at a sixth voltage VPP', an erase line ELM coupled to the unselected memory cell $300_{M,1}$ is at the third voltage VEE', and a word line WLM coupled to the unselected memory cell $300_{M,1}$ is at the fourth voltage VINH1. In FIG. 9, the difference between the sixth voltage VPP' and the fifth voltage VSS is smaller than half of the difference between the first voltage VPP and the fifth voltage VSS.

Since the erase line ELM is at the third voltage VEE' during the program operation of the memory cell $300_{1,1}$, the erase element 130 will not breakdown and the memory cell $300_{M,1}$ will not be programmed unexpectedly. Also, the control line CLM is at the sixth voltage VPP' to ensure that the memory cell $300_{M,1}$ is not programmed.

In addition, since memory cells in the same column but different memory pages is coupled to the same source line and the same bit line, the word line may be at the fourth voltage VINH1 for reducing the gate-induced drain leakage (GIDL) current. For example, during the program operation of the memory cell $300_{1,1}$ and the program inhibit operation of the memory cell $300_{1,N}$, the source line SLN and the bit line BLN coupled to the memory cell $300_{M,N}$ are at the seventh voltage VINH2. If the word line WLM is at the fifth voltage VSS, the big reverse voltage difference may cause GIDL currents at the source transistor 314 of the memory cell $300_{M,N}$. However, the word line WLM at the fourth voltage VINH1 can avoid the GIDL currents efficiently while not affecting the operations of other memory cells.

Figure 10:
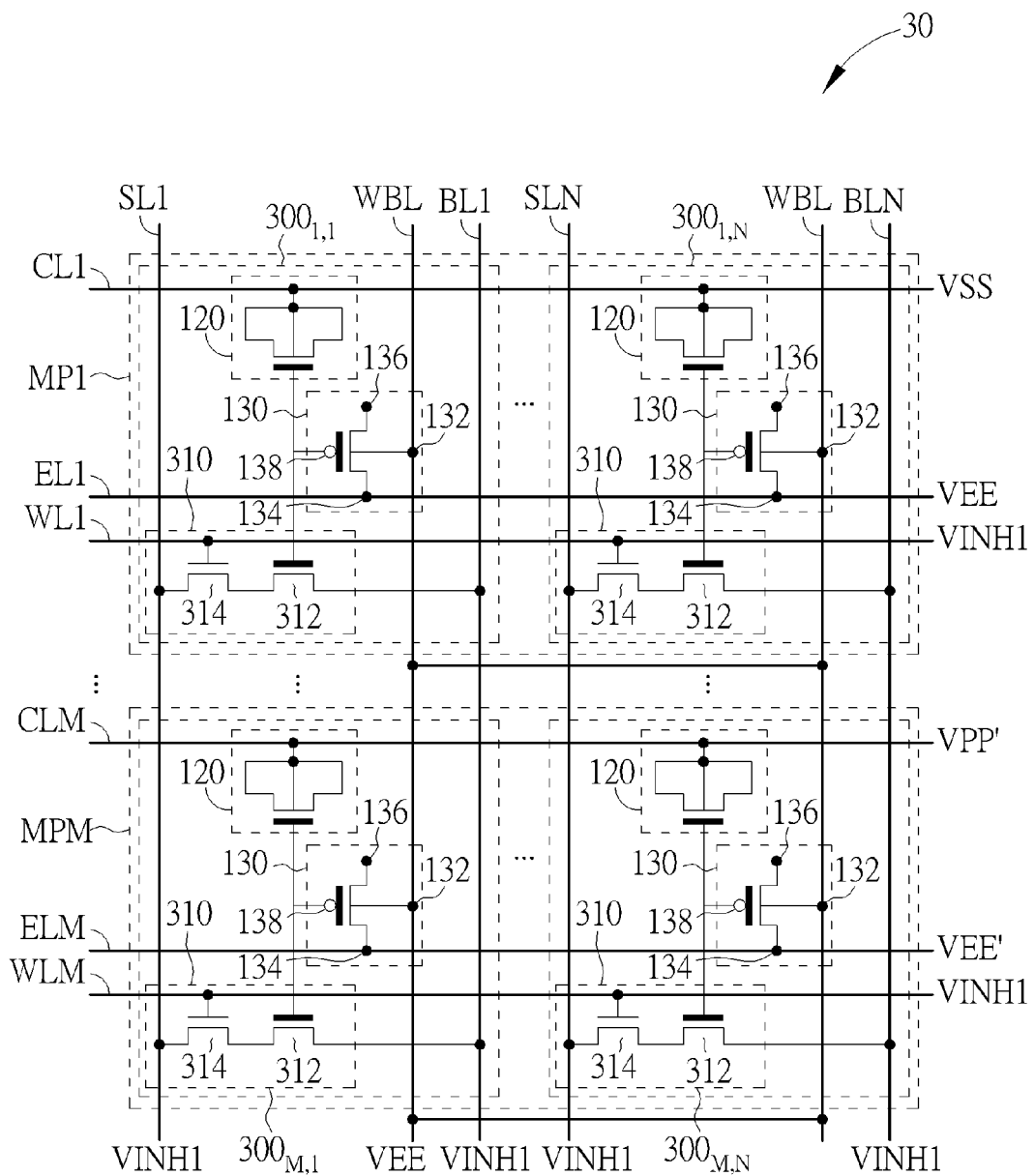
FIG. 10 shows voltages of the signals during an erase operation of a memory cell in the memory array of FIG. 8.

FIG. 10 shows voltages of the signals during an erase operation of the memory cell $300_{1,1}$ in the memory array 30.

During the erase operation of the memory cell $300_{1,1}$, the erase line EL1 is at the second voltage VEE, the control line CL1 is at a fifth voltage VSS, the source line and the bit line are both at the fourth voltage VINH1 or at the fifth voltage VSS, while the word line is at the fourth voltage VINH1 or at the fifth voltage VSS.

In this case, the high voltage of the erase line EL1 can cause FN electron tunneling ejection so the memory cell $300_{1,1}$ can be erased. In addition, since the erase line EL1 has the greatest voltage, that is, the second voltage VEE, among all the signals during the erase operation of the memory cell $300_{1,1}$, the well bias line WBL would be at the second voltage VEE.

In addition, during the erase operation of the memory cell $300_{1,1}$, memory cells in unselected memory pages, such as the memory page MPM, should not be erased. For example, to prevent the memory cell $300_{M,1}$ in the unselected memory page MPM from being erased, the voltage of the erase line ELM should not be too high. However, since the well bias line WBL is at the second voltage VEE, the voltage of the erase line ELM cannot be too low; otherwise, the erase element 130 of the memory cell memory cell $300_{M,1}$ may breakdown. Therefore, in FIG. 10, the erase line ELM can be at the third voltage VEE'.

In this case, the voltage of the erase line ELM is not high enough to erase the memory cell $300_{M,1}$ and is not low enough to make the erase element 130 breakdown. According to the voltage of the erase line ELM, the control line CLM can be at a sixth voltage VPP'. In FIG. 10, the difference between the sixth voltage VPP' and the fifth voltage VSS is smaller than half of the difference between the second voltage VEE and the fifth voltage VSS. Also, the word line WLM, the source line SL1, and the bit line BL1 can be at approximate voltages so that the memory cell $300_{M,1}$ will not be programmed or erased unexpectedly by the erase line ELM while the GIDL current can be prevented. In some embodiments, the word line WLM, the source line SL1, and the bit line BL1 can be at the fourth voltage VINH1. Since the erase line EL1 coupled to the memory cell $300_{1,1}$ is at an even higher voltage, the second voltage VEE, and the control line CL1 coupled to the memory cell $300_{1,1}$ is at a low voltage, the fifth voltage VSS, the memory cell $300_{1,1}$ can still be erased normally even with the source line SL1 and the bit line BL1 being at the fourth voltage VINH1.

In addition, in some embodiments of the present invention, the memory array 30 can be erased by page. That is, memory cells at the same memory page, such as the memory cells $300_{1,1}$ to $300_{1,N}$ in the memory page MP1, will be erased at the same time. In this case, the source lines SL1 to SLN and the bit lines BL1 to BLN coupled to the memory cells $300_{1,1}$ to $300_{1,N}$ may all be at the fourth voltage VINH1 during the erase operation.

Figure 11:
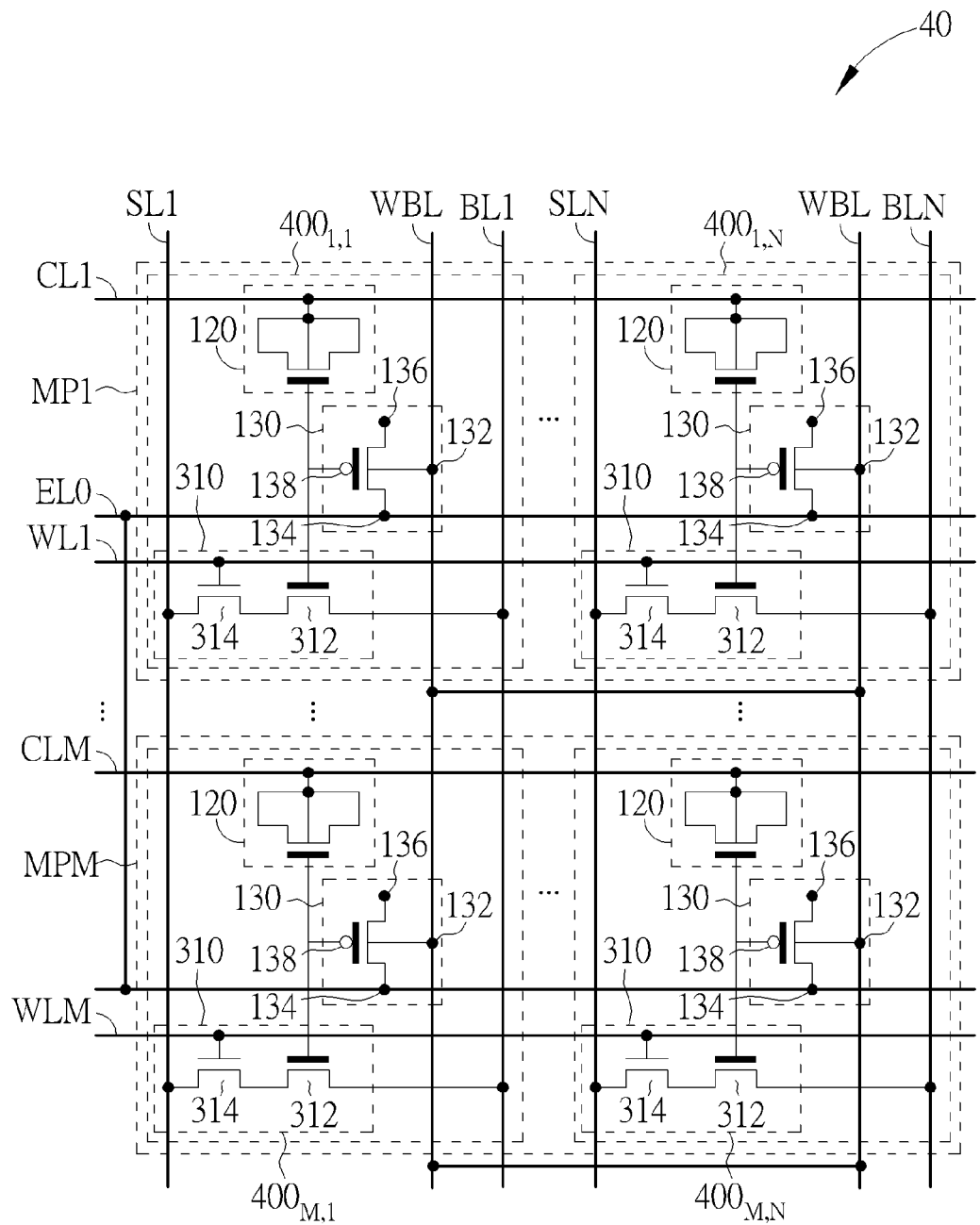
FIG. 11 shows a memory array according to another embodiment of the present invention.

In some embodiments of the present invention, the memory array can be erased by sector. That is, memory cells in the memory array can all be erased at the same time. FIG. 11 shows a memory array 400 according to one embodiment of the present invention. The memory arrays 400 and 300 have similar structures. The difference between these two is in that the memory cells $400_{1,1}$ to $400_{1,N}$, ..., and $400_{M,1}$ to $400_{M,N}$ are all coupled to the same erase line EL0 so the memory cells $400_{1,1}$ to $400_{1,N}$, ..., and $400_{M,1}$ to $400_{M,N}$ in the memory array 40 will all be erased at the same time.

Figure 12:
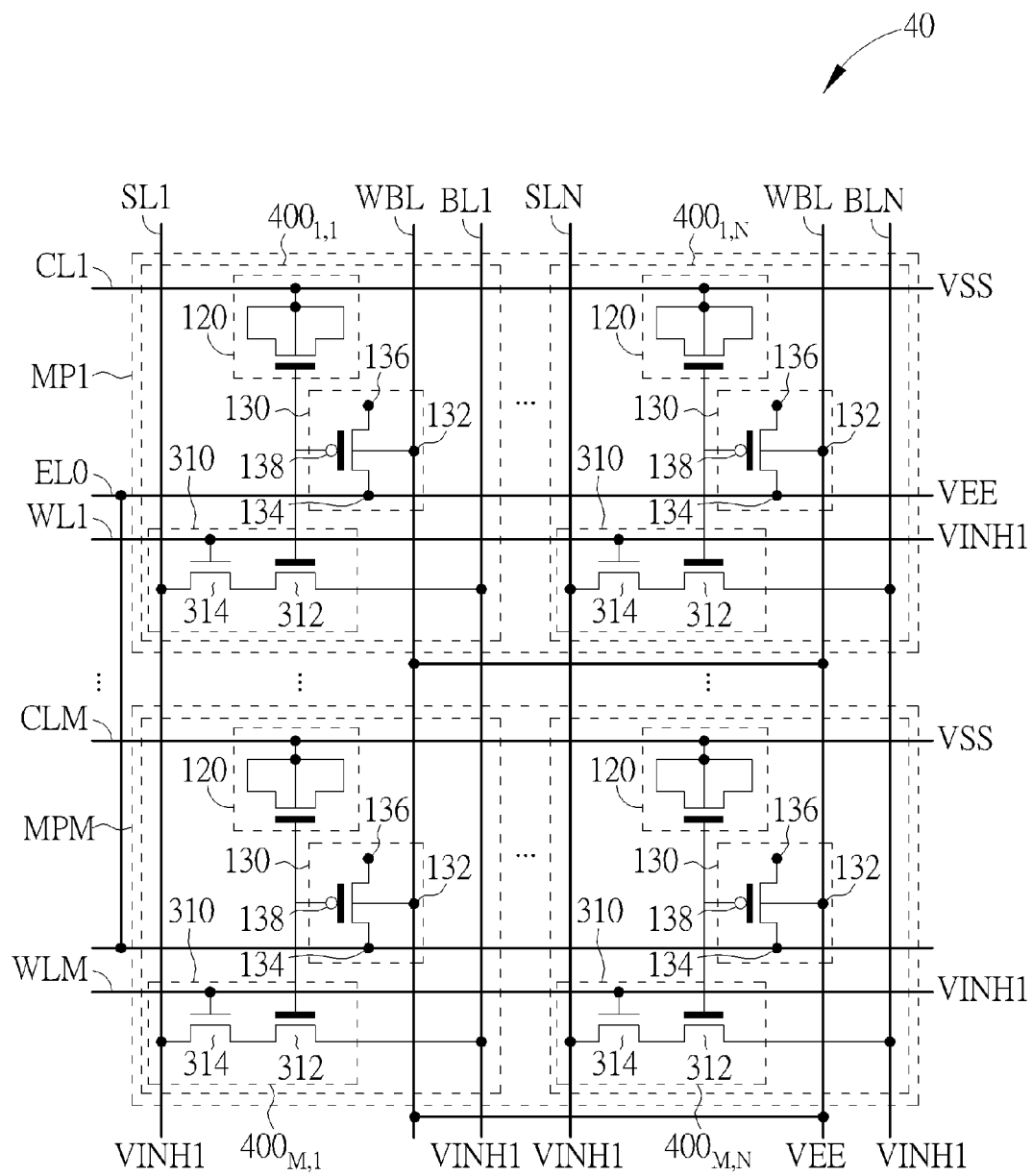
FIG. 12 shows voltages of the signals during an erase operation of a memory cell in the memory array of FIG. 11.

FIG. 12 shows voltages of the signals during an erase operation of the memory cell $400_{1,1}$ in the memory array 40.

During the erase operation of the memory cells $400_{1,1}$, the erase line EL0 is at the second voltage VEE, the control line CL1 is at the fifth voltage VSS, the source line SL1 and the bit line BL1 are both at the fourth voltage VINH1 or at the fifth voltage VSS, while the word line is at the fourth voltage VINH1 or at the fifth voltage VSS. In this case, the high voltage of the erase line EL0 can cause FN electron tunneling ejection so the memory cell $400_{1,1}$ can be erased.

Since the memory cells $400_{1,1}$ to $400_{1,N}$, ..., and $400_{M,1}$ to $400_{M,N}$ in the memory array 40 are erased at the same time, voltages of the signals received by all the memory cells $400_{1,1}$ to $400_{1,N}$, ..., and $400_{M,1}$ to $400_{M,N}$ can be the same.

In addition, since the erase line EL0 is at the third voltage VEE' during the program operation and the program inhibit operation, the memory array 40 can be operated with the same principle as the memory array 30 during the program operation and the program inhibit operation as shown in FIG. 9.

Consequently, the memory cells $400_{1,1}$ to $400_{1,N}$, ..., and $400_{M,1}$ to $400_{M,N}$ of the memory array 40 can all be disposed in the same deep doped region. Since different memory pages MP1 to MPM in the memory array 40 are disposed in one deep doped region, the spacing rules between deep doped regions will no longer be used to limit the circuit area of the memory array 40, and the circuit area of the memory array 20 can be reduced significantly.

In summary, according to the memory arrays provided by the embodiments of the present invention, the memory cells of different memory pages in a memory array can all be disposed in the same deep doped region. Since different memory pages in the memory array are disposed in one deep doped region, the spacing rules between deep doped regions will no longer be used to limit the circuit area of the memory array, and the circuit area of the memory array can be reduced significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array comprising:
a plurality of memory pages, each memory page comprising a plurality of memory cells, and each memory cell comprising:
  a floating gate module comprising a floating gate transistor, and configured to control the floating gate transistor according to a source line, a bit line and a word line, the floating gate transistor having a first terminal, a second terminal and a floating gate;
  a control element having a body terminal coupled to a control line, a first terminal coupled to the body terminal, a second terminal coupled to the body terminal, and a control terminal coupled to the floating gate; and
  an erase element having a body terminal configured to receive a first voltage during a program operation and a program inhibit of the memory cell and receive a second voltage during an erase operation of the memory cell, a first terminal coupled to an erase line, a second terminal coupled to the first terminal of the erase element or being floating, and a control terminal coupled to the floating gate;
wherein:
the floating gate module is disposed in a first well;
the erase element is disposed in a second well;
the control element is disposed in a third well;
the first well, the second well and the third well are disposed in a deep doped region;
memory cells of the plurality of memory pages are all disposed in the deep doped region;
the control line is at the first voltage during the program operation;
the erase line is at the second voltage during the erase operation; and
control elements of the memory cells in a same memory page are disposed in the same third well.

2. The memory array of claim 1, wherein:
memory cells in a same memory page are coupled to a same control line, a same erase line, and a same word line; and
the memory cells in the same memory page are coupled to different source lines and different bit lines.

3. The memory array of claim 1, wherein the floating gate module further comprises:
a source transistor having a first terminal coupled to the source line, a second terminal coupled to the first terminal of the floating gate transistor, and a control terminal coupled to the word line; and
a bit transistor having a first terminal coupled to the second terminal of the floating gate transistor, a second terminal coupled to the bit line, and a control terminal coupled to the word line.

4. The memory array of claim 1, wherein:
the deep doped region is a deep N-well or an N-type buried layer;
the first well and the third well are P-wells disposed in the deep doped region; and
the second well is an N-well disposed in the deep doped region.

* * * * *